United States Patent [19]
Zwack

[11] Patent Number: 5,467,059
[45] Date of Patent: Nov. 14, 1995

[54] TEMPERATURE-STABILIZED OSCILLATOR CIRCUIT HAVING HEATING ELEMENTS THAT CAN BE EXTERNALLY INFLUENCED

[75] Inventor: Eduard Zwack, Puchheim, Germany

[73] Assignee: Siemens Aktiengesellschaft, Munich, Germany

[21] Appl. No.: 178,836

[22] Filed: Jan. 7, 1994

[30] Foreign Application Priority Data

Jan. 29, 1993 [DE] Germany .......... 43 02 529.3

[51] Int. Cl.⁶ .................................. H03B 1/00
[52] U.S. Cl. .................... 331/70; 331/66
[58] Field of Search .................. 219/209, 210; 331/69, 70, 66, 176

[56] References Cited

U.S. PATENT DOCUMENTS

| | | | |
|---|---|---|---|
| 3,287,658 | 11/1966 | Sulzer | 331/69 |
| 4,216,371 | 8/1980 | Marotel | 219/501 |
| 4,839,613 | 6/1989 | Echols et al. | 331/69 |
| 4,893,097 | 1/1990 | Zwack | 331/176 |
| 4,985,687 | 1/1991 | Long | 331/69 |

Primary Examiner—Benny Lee
Assistant Examiner—David H. Vu
Attorney, Agent, or Firm—Hill, Steadman & Simpson

[57] ABSTRACT

In an oscillator circuit (VCOS) having at least one heating element (HE) that keeps the temperature constant, the clock signals (ts) that are formed are conducted via an output connection (AV) to an output (TA) of the oscillator circuit (VCOS). An impedance evaluation unit (WAE) is inserted into this output connection (AV) and detects changes in an impedance or of a resistor (R4, R5) connected to the output (TA) and the heating element (HE) is activated or deactivated in response to changes in the impedance.

14 Claims, 1 Drawing Sheet

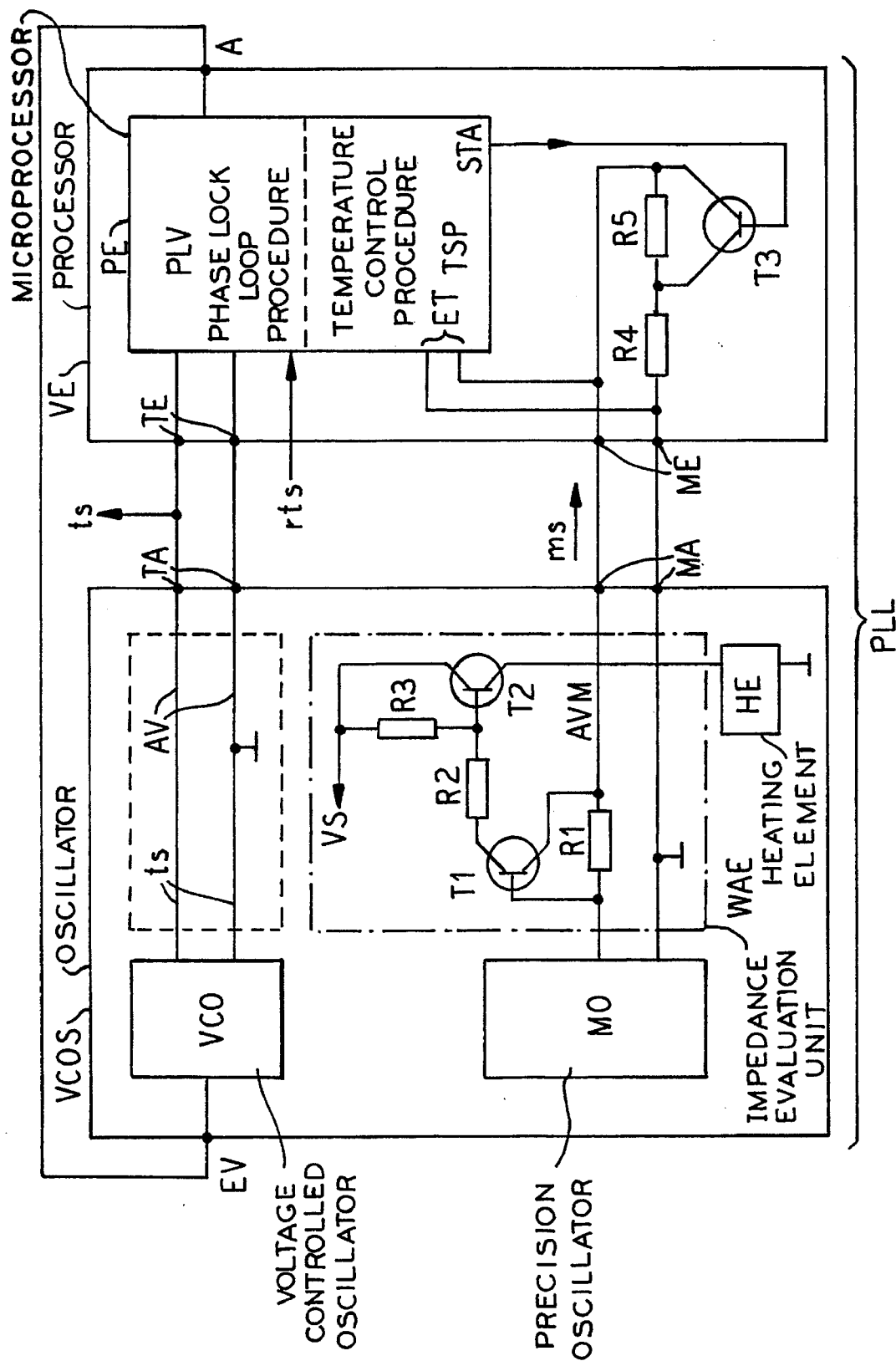

TEMPERATURE-STABILIZED OSCILLATOR CIRCUIT HAVING HEATING ELEMENTS THAT CAN BE EXTERNALLY INFLUENCED

BACKGROUND OF THE INVENTION

Telecommunications equipment, particularly communications equipment, is equipped with temperature-stabilized oscillator circuits for the purpose of forming high-precision alternating signals, particularly clock signals. The oscillator circuits are mainly realized by voltage-controlled oscillator circuits that form part of a phase-locked loop. With the assistance of these phase-locked loops, the clock signals formed in the communication systems are controlled synchronously with respect to their phase to a reference clock signal supplied to the communications system, for example, from a higher-ranking clock means. The phase-locked loop is mainly formed by an oscillator circuit and by a means that further-processes the clock signals. The control signals for controlling the heating elements are usually formed in these further-processing means, for example, a microprocessor system equipped with appropriate programs, and are communicated to a separate input of the oscillator circuit for controlling the heating elements. The measurement of the current temperature in an oscillator circuit is thereby effected either via a temperature sensor element, for example a semiconductor temperature sensor, or by a temperature-measuring oscillator. A temperature-measuring oscillator is realized such that optimally large frequency changes of the formed clock signals are produced for temperature changes. These temperature sensor signals or measuring oscillator signals are evaluated in the further-processing means and the current temperature of the oscillator circuit is calculated. Dependent on the result of the temperature measurement, the heating element in the oscillator circuit is subsequently activated via separate connections or is switched off in such a way that the temperature of the oscillator circuit remains largely constant.

SUMMARY OF THE INVENTION

It is an object of the present invention to reduce the outlay for an external control of the heating elements arranged in the oscillator circuit.

In general terms the present invention is an oscillator circuit having at least one heating element that keeps the temperature constant. The oscillation signals that are formed are conducted via an output connection to an output of the oscillator circuit. An impedance evaluation unit is inserted into the output connection and is fashioned such that a change in an impedance connected to the output of the oscillator circuit is recognized and at least one heating element is activated or deactivated in response to changes in the impedance.

An important aspect of the oscillator circuit of the present invention is that an impedance evaluation unit is inserted at the exiting output connection between the actual oscillator and the output of the oscillator circuit and is fashioned such that a variation of an impedance or a resistor connected at the output is recognized and the heating element or the heating elements are activated or deactivated. An important advantage of the oscillator circuit of the present invention is that a separate connection between a further-processing means and the oscillator circuit can be foregone for activating or deactivating the heating elements. Thus, the outlay with respect to plug devices and connecting lines is substantially reduced.

Given employment of a precision oscillator in an oscillator circuit, the impedance evaluation unit is especially advantageously connected to the output connection between precision oscillator and the measured output of the oscillator circuit. The activation or deactivation of the heating elements is thereby effected by a change of an impedance or of a resistor connected to the measured output of the oscillator circuit. In this realization, the temperature of the oscillator circuit as well as the activation or deactivation of the heating elements can be implemented via a single measured output of the oscillator circuit.

In an advantageous development of the oscillator circuit of the present invention, the heating element or the heating elements is or are realized by filament resistances, these being driven into a heating or quiescent condition by a serially connected control resistor. This represents an especially economical realization of a heating element including the appertaining control thereof.

The impedance evaluating means is advantageously realized by a resistor inserted into the output connection as well as by a switching transistor whose emitter-base path is connected as an emitter follower to the control input of the control transistor parallel to the resistor and to the collector thereof. The switching of the switching transistor is effected by connecting different impedances or resistances to the output or measured output of the oscillator circuit. The activation or deactivation of the heating elements is possible using this extremely low-outlay realization of an impedance evaluation means by simply varying an impedance, usually realized with resistors, connected to the output or measured output of the oscillator circuit.

The impedance that can be connected to the output or measured output is especially economically realized by two resistors, whereby one of the two resistors is activated or deactivated by a further switching transistor for the purpose of modifying the impedance. The resistor that is inserted into the output connection, as well as the two resistance forming the impedance are dimensioned such that, first, the switching transistor is switched by activating or deactivating a resistor and, second, that the further-processing of the clock signals or measured signals continues to be assured. The further-processing, for example, occurs in a processing means of a phase-locked loop, whereby the impedance existing in the two resistors and the further switching transistor as well as a control procedure required therefor are provided in the processing means.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawing, and in which:

The single Figure is a block diagram of an oscillator circuit of the present invention.

DESCRIPTION OF THE PREFERRED EMBODIMENT

The single Figure shows a phase-locked loop PLL that is formed of a voltage-controlled oscillator circuit VCOS and of a processing means VE. The oscillator circuit VCOS has a clock output TA to which the clock signals ts, for example, digital clock signals, formed in a voltage-controlled oscillator VCO are conducted via output connections AV. The voltage control input EV of the oscillator circuit VCOS is connected to the output A of the processing means VE.

It is also assumed for the exemplary embodiment that a precision oscillator MO is arranged in the oscillator circuit VCOS. This precision oscillator MO is provided for measuring the temperature of the oscillator circuit VCOS. To this end, the precision oscillator MO is fashioned such that optimally substantial frequency changes of the digital measured signals ms occur for temperature changes. This is usually achieved by known specific temperature-measuring crystals that are not shown. The measured signals ms formed in this manner proceed via a further output connection AVM to a measured output MA of the oscillator circuit VCOS. A resistor R1 is inserted into one of the two lines of the further output connections AVM. The base-emitter path of a first NPN switching transistor T1 is connected in parallel to this resistor R1. The collector of this first switching transistor T1 is connected via a second resistor R2 to the base of a second PNP control switching transistor T2 in an emitter-follower circuit. The base of this control switching transistor T2 is connected to the supply voltage VS of the oscillator circuit VCOS via a third resistor R3 as well as via its emitter. The collector of the second switching transistor T2 is connected to the heating element HE that is preferably realized by appropriate heating resistors or filament rheostats.

The measured output MA of the oscillator circuit VCOS is conducted to a measuring input ME of the processing means VE via appropriate connections. The two inputs of the measuring input ME are connected both to a processor means PE, preferably a microprocessor, as well as via two serially connected, fourth and fifth resistors R4, R5. The collector-emitter path of a third transistor T3 is connected in parallel to the fifth resistor R5, whereby the base of this third transistor T3 is connected to a control output STA of the processor means PE. Further, the clock signals ts and reference clock signals rts which, for example, are supplied from a higher-ranking clock means are supplied to this processor means PE via a clock signal input TE. The functions that are relevant to the phase-locked loop such as, for example, phase comparison, low-pass function and digital-to-analog conversion of the control signals are realized with a PLL procedure PLV implemented in the processor means PE. The measured signals ms incoming at the input ET are evaluated with respect to their frequency, and the current temperature of the oscillator circuit is derived therefrom using a further temperature control procedure TSP implemented in the processor means PE. Corresponding to the derived result of the temperature measurement, the third control transistor T3 is switched via the control output STA such that the fifth resistor R5 is either substantially shorted or is introduced between the two inputs of the measuring input ME in series with the fourth resistor R4. As a result thereof, a change in impedance, i.e. a change in resistance is effected at the measured output MA of the oscillator circuit VCOS. This impedance change at the measured output MA of the oscillator circuit VCOS produces different voltage drops at the first resistor R1. The first, fourth and fifth resistor R1, R4, R5 are dimensioned such that the voltage drop at the first resistor R1 causes the first transistor T1 to be either conductive or non-conductive. This conductivity or non-conductivity of the first transistor T1 drives the second transistor T2 either into its non-conductive or conductive condition. As a result thereof, the heating element HE is either activated or deactivated.

The first, second and third resistors R1, R2, R3, as well as the first and second transistors T1, T2 form an impedance evaluation unit WAE, as shown with broken lines in the Figure. Given the absence of a precision oscillator MO, for example given a realization of an oscillator circuit VCOS with a temperature sensor, the impedance evaluation unit WAE can be introduced into the output connection AV between the oscillator VCO and the clock output TA, as shown with broken lines in the single Figure. The control unit formed by the fourth and fifth resistors R4, R5 and by the third switching transistor T3 is thereby to be connected to the clock input TE of the processing means VE. In both versions, the third and fourth resistors R4, R5 are dimensioned such that a recognition and evaluation of the incoming measured signals ms or clock signals ts is possible given inserted and shorted fifth resistor R5. Due to the insertion of an impedance evaluation means WAE in the oscillator circuit VCOS and of a control unit in the processing means VE, a separate connection for controlling the heating element HE with the processing means VE can be foregone. The savings in outlay with respect to plugs and connecting lines to be potentially inserted exceed the slight circuit-oriented outlay.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. An oscillator circuit having at least one heating element for keeping the temperature of the oscillator circuit substantially constant, comprising:

oscillator means for forming oscillation signals;

oscillator connection means for connecting said oscillator means to an oscillator output of the oscillator circuit, said oscillator connection means conveying said oscillation signals from said oscillator means to said oscillator output; and said oscillator connection means having an impedance evaluation means for detecting a change in the impedance of an impedance means connected to said oscillator output, said at least one heating element being activated and deactivated as a function of the change in said impedance of said impedance means.

2. The oscillator circuit according to claim 1, wherein said oscillator circuit further comprises: a precision oscillator that provides oscillating measured signals; a precision oscillator connection means for connecting said precision oscillator to a measured output of the oscillator circuit; said impedance evaluation means being arranged in said precision oscillator connection means and said impedance means being connected to said measured output.

3. The oscillator circuit according to claim 2, wherein said at least one heating element is a heating resistor, and wherein said at least one heating element is switched between a heating mode and a quiescent mode by a serially connected switching transistor.

4. The oscillator circuit according to claim 2, wherein said impedance evaluation means comprises: a first resistor connected between said precision oscillator and said measured output; a first switching transistor having an emitter-base path connected in parallel to said first resistor and a collector connected to a second switching transistor in an emitter follower configuration; switching of the first switching transistor and of the second switching transistor being effected by a change for one impedance value to another different impedance value of the impedance means.

5. The oscillator circuit according to claim 2, wherein the impedance means comprises two series connected resistors and a switching transistor connected across one of said two serial connected resistors, whereby switching of said switching transistor changes the impedance value of said impedance means.

6. The oscillator circuit according to claim 1, wherein said at least one heating element is a heating resistor, and wherein said at least one heating element is switched between a heating mode and a quiescent mode by a serially connected switching transistor.

7. The oscillator circuit according to claim 1, wherein said impedance evaluation means comprises: a first resistor connected between said oscillator means and said oscillator output; a first switching transistor having all emitter-base path connected in parallel to said first resistor and a collector connected to a second switching transistor in an emitter follower configuration; switching of the first switching transistor and of the second switching transistor being effected by a change for one impedance value to another different impedance value of the impedance means.

8. The oscillator circuit according to claim 1, wherein the impedance means comprises two series connected resistors and a switching transistor connected across one of said two serial connected resistors, whereby switching of said switching transistor changes the impedance value of said impedance means.

9. An oscillator circuit having at least one heating element for keeping the temperature of the oscillator circuit substantially constant, comprising:

oscillator means for forming oscillation signals;

oscillator output circuit connecting said oscillator means to an oscillator output of the oscillator circuit, said oscillator output circuit conveying said oscillation signals from said oscillator means to said oscillator output;

a precision oscillator that provides oscillation measured signals;

a measured output circuit connecting said precision oscillator to a measured output of the oscillator circuit; and an impedance evaluation means connected to said at least one heating element and arranged in said measured output circuit for detecting a change in an impedance means connected to said measured output of the oscillator circuit, said at least one heating element being activated and deactivated as a function of the change in said impedance means.

10. The oscillator circuit according to claim 9, wherein said at least one heating element is a heating resistor, and wherein said at least one heating element is switched between a heating mode and a quiescent mode by a serially connected switching transistor.

11. The oscillator circuit according to claim 9, wherein said impedance evaluation means comprises: a first resistor connected between said precision oscillator and said measured output; a first switching transistor having an emitter-base path connected in parallel to said first resistor and a collector connected to a second switching transistor in an emitter follower configuration; switching of the first switching transistor and of the second switching transistor being effected by a change for one impedance value to another different impedance value of the impedance means.

12. The oscillator circuit according to claim 9, wherein the impedance means comprises two series connected resistors and a switching transistor connected across one of said two serial connected resistors, whereby switching of said switching transistor changes the impedance value of said impedance means.

13. An oscillator circuit having at least one heating element for keeping the temperature of the oscillator circuit substantially constant, comprising:

oscillator means for forming oscillation signals;

oscillator output circuit connecting said oscillator means to an oscillator output of the oscillator circuit, said oscillator output circuit conveying said oscillation signals from said oscillator means to said oscillator output;

a precision oscillator that provides oscillation measured signals;

a measured output circuit connecting said precision oscillator to a measured output of the oscillator circuit;

an impedance evaluation means connected to said at least one heating element and arranged in said measured output circuit for detecting a change in an impedance means connected to said measured output of the oscillator circuit, said at least one heating element being activated and deactivated as a function of the change in said impedance means, said impedance evaluation means having a first resistor connected between said precision oscillator and said measured output, and having a first switching transistor with an emitter-base path connected in parallel to said first resistor and a collector connected to a second switching transistor in an emitter follower configuration, switching of the first switching transistor and of the second switching transistor being effected by a change from one impedance value to another different impedance value of the impedance means; and said impedance means having two series connected resistors and a third switching transistor connected across one of said two serial connected resistors, whereby switching of said third switching transistor changes the impedance value of said impedance means.

14. The oscillator circuit according to claim 13, wherein said at least one heating element is a heating resistor, and wherein said at least one heating element is switched between a heating mode and a quiescent mode by the second switching transistor.

* * * * *